United States Patent
Doy et al.

(10) Patent No.: US 11,102,583 B1
(45) Date of Patent: Aug. 24, 2021

(54) CURRENT VECTORING TO ELECTROACOUSTIC OUTPUT TRANSDUCERS HAVING MULTIPLE VOICE COILS

(71) Applicant: CIRRUS LOGIC INTERNATIONAL SEMICONDUCTOR, LTD., Edinburgh (GB)

(72) Inventors: Anthony S. Doy, Los Gatos, CA (US); Jeffrey A. May, Dripping Springs, TX (US)

(73) Assignee: CIRRUS LOGIC, INC., Austin, TX (US)

( * ) Notice: Subject to any disclaimer, the term of this patent is extended or adjusted under 35 U.S.C. 154(b) by 0 days.

(21) Appl. No.: 16/829,286

(22) Filed: Mar. 25, 2020

Related U.S. Application Data

(60) Provisional application No. 62/824,545, filed on Mar. 27, 2019, provisional application No. 62/836,097, filed on Apr. 19, 2019.

(51) Int. Cl.
| | | |
|---|---|---|
| *H04R 9/02* | (2006.01) | |
| *H03G 5/16* | (2006.01) | |
| *H04R 3/00* | (2006.01) | |

(52) U.S. Cl.
CPC ............... *H04R 9/025* (2013.01); *H03G 5/16* (2013.01); *H04R 3/00* (2013.01)

(58) Field of Classification Search
CPC .......... H04R 9/025; H04R 3/00; H04R 3/002; H04R 29/003; H03G 5/16
See application file for complete search history.

(56) References Cited

U.S. PATENT DOCUMENTS

| | | |
|---|---|---|
| 6,535,058 B1 | 3/2003 | Kim |
| 8,598,957 B2 | 12/2013 | Lee et al. |
| 8,958,597 B2 | 2/2015 | Boyd |
| 9,232,305 B2 | 1/2016 | French et al. |
| 9,674,593 B2 | 6/2017 | Gautama et al. |

(Continued)

OTHER PUBLICATIONS

Toverland, John, "Thermal modelling of voice coils in microspeakers", Master's Thesis, Linköping, University, May 2016. Linkoping, SE.

(Continued)

*Primary Examiner* — Jason R Kurr
(74) *Attorney, Agent, or Firm* — Mitch Harris, Atty at Law, LLC; Andrew M. Harris

(57) ABSTRACT

An audio power output circuit provides a pair of output signals to an audio output transducer that has two different voice coils. Using a measured or predicted position of the voice coil assembly with respect to the transducer's magnetic field, a processing circuit generates the pair of signals such that a first relationship between a first one of the pair of output signals and an audio input signal and a second relationship between a second one of the pair of the output signals vary with the position of the voice coil. Offset in the Dynamic Mean Position (DMP) can be compensated for without adding low frequency or direct current components that compromise the dynamic range of the transducer. The efficiency, acoustic output power and/or linearity of the acoustic output of the transducer may be optimized by tailoring the first and second relationship to a particular target performance.

19 Claims, 7 Drawing Sheets

(56) References Cited

U.S. PATENT DOCUMENTS

| | | | |
|---|---|---|---|
| 2009/0028371 A1* | 1/2009 | Bailey | H04R 9/025 381/386 |
| 2012/0121098 A1* | 5/2012 | Gautama | H04R 3/007 381/59 |
| 2016/0127833 A1* | 5/2016 | Yasuda | H04R 29/003 381/59 |

OTHER PUBLICATIONS

Klippel R&D, "Application Note AN-29: Loudspeaker Limits and Protection Systems", Apr. 4, 2012. Dresden, DE.

* cited by examiner

CURRENT VECTORING TO ELECTROACOUSTIC OUTPUT TRANSDUCERS HAVING MULTIPLE VOICE COILS

The present Application Claims priority under 35 U.S.C. § 119(e) to U.S. Provisional Patent Application 62/824,545 filed on Mar. 27, 2019 and to U.S. Provisional Patent Application 62/836,097 filed on Apr. 23, 2019, the disclosures of which are incorporated herein by reference.

BACKGROUND

1. Field of Disclosure

The field of representative embodiments of this disclosure relates to methods, circuits and systems that improve acoustic power output, efficiency and/or linearity when supplying power to a transducer having multiple voice coils.

2. Background

Voice coil-based acoustic output transducers, such as loudspeakers that may be connected to a wide range of amplification systems, and micro speakers that may be included in personal devices, headphones, earbuds or other devices such as hearing aids, typically contain a single voice coil that is energized by an amplifier or pulse-width modulator output. The voice coil moves due to an electromotive force provided between the voice coil and a permanent magnetic field provided by a magnet. Other types of acoustic output transducers, known as field coil speakers, operate similarly, but have a magnetic field provided by a second, "field coil" that surrounds the voice coil.

Multiple voice coil speakers are available that allow adjustment of speaker impedance to provide optimum power transfer from an amplifier by either connecting a pair of voice coils in parallel or series to change the impedance presented to the amplifier. The pairs of voice coils may be overlapped on the voice coil former, or the voice coils may be displaced along on the voice coil former by some distance. Other systems allow summing of multiple amplifier outputs by providing pairs of independent voice coils, so that the amplifier outputs are not electrically connected, but both contribute to the electromotive force generated by the electromagnetic interaction of the voice coil and the magnetic field of the speaker. The amplified signals provided to the pair of voice coils are typically generated from a common audio input signal by a pair of amplifiers and are typically identical in voltage. Less commonly, a speaker will have a segmented voice coil, in which the voice coils do not overlap, but are typically electrically connected to form one or more "taps".

The electroacoustic power transfer of a speaker is very non-linear at high excursion levels and varies in efficiency with signal strength, in part due to the varying magnetic coupling as the voice coil assembly moves into and out of the magnetic field of the speaker, and in part due to the mechanical structure of the speaker cone and support structure that attaches the speaker cone to the speaker frame. Further, an offset of the voice coil known as the Dynamic Mean Position (DMP) may vary over time, causing the displacement of the voice coil from the static (non-energized) rest position during operation, which will also change the efficiency of the speaker. In particular, micro speakers are prone to suffering from DMP drift, as they are typically constructed from thin materials that cause non-linear electro-mechanical behavior and are typically enclosed in a manner that provides little air volume behind the speaker, which may also lead to non-linear behavior.

Therefore, it would be advantageous to provide an improved performance in acoustic output transducers, in particular when supplying power to speakers or other acoustic output transducers having multiple voice coils.

SUMMARY

Improved operation of multiple voice coil transducer systems may be accomplished in amplifier/signal processing systems and amplifier circuits and their methods of operation.

The methods, systems and circuits supply a differing pair of audio output signals for driving at least two different voice coils of an audio output transducer. An audio input signal is received and the pair of audio output signals is generated from the audio input signal and an indication of a position of the voice coils of the audio output transducer with respect to a magnetic field of the audio output transducer, so that a first relationship between the first output signal and the audio input signal and a second relationship between the second output signal and the audio input signal vary dependent on the indication of the position of the voice coil.

The method, systems and circuits may optimize acoustic power output, efficiency, and/or linearity of the relationship between the acoustic output and the input signal, according to a targeted performance. Dynamic Mean Position (DMP) can be reduced by applying current that is distributed according to a differing relationship among the multiple voice coils.

The summary above is provided for brief explanation and does not restrict the scope of the Claims. The description below sets forth example embodiments according to this disclosure. Further embodiments and implementations will be apparent to those having ordinary skill in the art. Persons having ordinary skill in the art will recognize that various equivalent techniques may be applied in lieu of, or in conjunction with, the embodiments discussed below, and all such equivalents are encompassed by the present disclosure.

DETAILED DESCRIPTION OF ILLUSTRATIVE EMBODIMENT

Figure 1A:
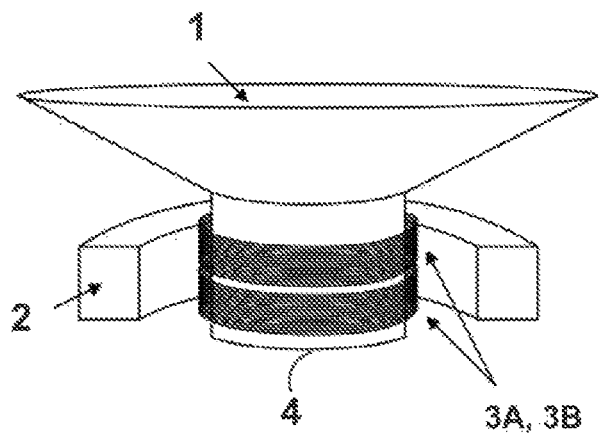
FIGS. 1A-1C are illustrations of speakers with a segmented voice coil arrangement as may be employed in the systems of FIG. 2A and FIG. 2B.

The present disclosure encompasses methods, systems and circuits that control the operation of an acoustic output transducer, such as a micro speaker or a loudspeaker that has two or more voice coils (including tapped coils) by "vectoring" the voltage (and thus the current) applied to the voice coils according to the input signal and a determination of position of the voice coil assembly with respect to the static magnetic field of the transducer. There are at least two aspects to the control implemented by the techniques disclosed herein: 1) reducing offset in the DMP of the transducer according to a determination of the position of the voice coil assembly by vectoring more current to the voice coil that has the best input current-to-electromotive force transfer in the direction that the DMP needs to be reduced; and 2) controlling the ratio of the amplified input current sent to the voice coils to accomplish a target goal, which may be linearity of the electroacoustic transfer function of the transducer, electroacoustic transfer efficiency of the transducer, or maximum power transfer to the transducer within limits of current and energy availability. The vectoring process may also include control of the excursion of the transducer for transducer protection.

By vectoring the input signal, what is meant is that an output voltage representing an input signal, rather than being simply amplified and provided identically, with or without a scaling factor, to both voice coils of the transducer, is intelligently apportioned according to the position of the voice coil assembly, in order to achieve one or more of the above-listed target criteria. The vector may be a scalar vector, or may be a phasor accounting for differences in phase of the individual voice coil transfer functions. The vectoring determines the current supplied to the voice coils, and the resulting total current will no longer be exactly proportional to the total voltage as will be illustrated in further detail below. The impedances to which the output voltages are applied are determined by the impedance of the individual voice coils, which in the illustrative examples below are half the impedance of the equivalent single voice coil speaker resulting from connecting the voice coils in series (or only driving the outside terminals in the case of a tapped voice coil winding). Splitting of the voltage is performed because the force provided to the voice coil is proportional to the product of the static magnetic field B of the transducer and the current i supplied to the voice coil, which is assumed proportional to the speaker input voltage according to the Thiele/Small parameter model. So, for a segmented voice coil system at a given position, the electromotive force F supplied to the voice coil assembly is $F=F_1+F_2+ \ldots F_N=Bl(c_1 i_1+c_2 i_2+ \ldots c_N i_N)$, where Bl is the presumed static magnetic field of the transducer multiplied by the length of the voice coil in the magnetic field, N is the total number of voice coils, where $F_k$ is the electromotive force supplied by the k-th voice coil and $i_k$ is the current supplied to the k-th voice coil and $c_N$ is a coupling constant. However, $c_N$ is a function of position for each voice coil, which can include variations of Bl along the length of the voice coil assembly, but also the portion of the voice coil that surrounds a permanent magnet, which effectively compensates for the variation in Bl due to the magnetic field to which the voice coil is coupled not being truly constant. Since the equivalent length of the individual voice coils are half that of the series connection of the voice coils, the product Bl*i is unaffected by the doubling of the current due to reduced impedance of the individual voice coils. The splitting of input voltage applied in the disclosed embodiments compensate in various ways for the variation of $c_N$ and the position of the voice coil assembly in order to more effectively apply available power and/or reduce the DMP of the voice coil assembly.

Figure 1B:
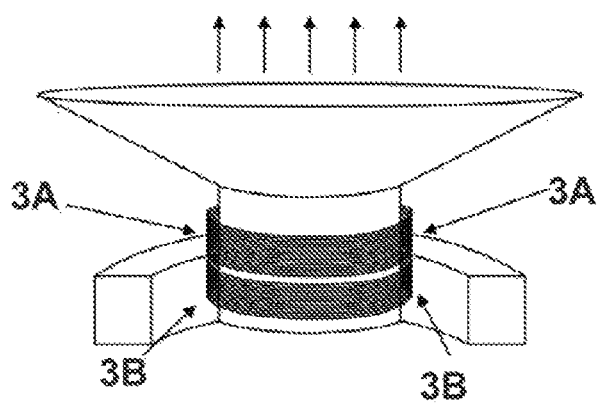
Figure 1C:
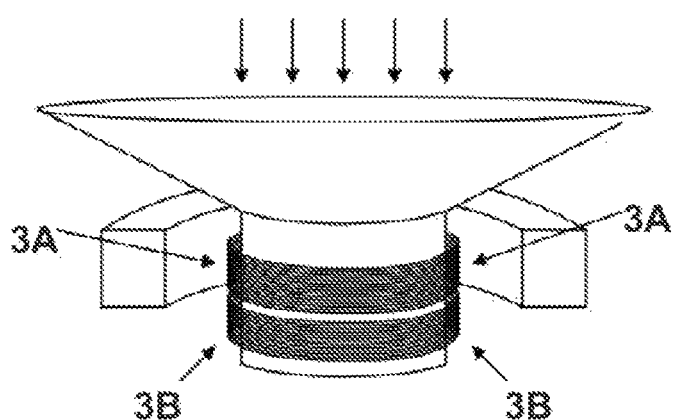

Referring now to FIG. 1A, an example of a dual-voice coil speaker 5 is shown. Speaker 5 is a permanent magnet type speaker with a ring magnet 2 shown cut-away to reveal a pair of segmented voice coils 3A, 3B in a neutral (non-energized) position. Voice coils 3A, 3B are wound on a form 4 that is attached to a cone 1 of speaker 5, which extends outward as shown in FIG. 1B when energized by positive current(s), by convention. and retracts inward as shown in FIG. 1C when energized by negative current(s), by convention. FIGS. 1A-1C illustrate one cause of non-linearity in the electromotive transfer function of speaker 5, which is exacerbated at segmented voice coil levels. When form 4, which determines the position of the voice coil assembly including voice coils 3A,3B, moves outward due to a positive current signal, voice coil 3A moves out of the central volume inside of ring magnet 2, and thus the current in voice coil 3A is interacting with a weaker magnetic field as the outward displacement of form 4 increases as illustrated in FIG. 1B. Therefore, increasingly more current is needed to move form 4 and therefore cone 1 outward by the same increment of the positive displacement and thus the electro-mechanical behavior becomes non-linear. Similarly, when form 4 moves inward due to a negative current signal, voice coil 3B moves out of the central volume inside of ring magnet 2, and thus the current in voice coil 3B is interacting with a weaker magnetic field and behaves non-linearly as the outward displacement of form 4 increases, as illustrated in FIG. 1C. The illustrations show a configuration that could be expected to behave symmetrically about the neutral position. However, due to practical mechanical considerations, and as will be shown in further detail below, the negative excursion generally differs in linearity from the positive excursion. For example, the negative excursion may cause more non-linear air behavior in mini speakers and for large loudspeakers, the magnet is typically both inside and surrounding the voice coil, resulting in a a more uniform magnetic field encountered by the voice coils for negative excursions, i.e., the voice coil does not extend past the magnet for negative excursions. The systems, methods and circuits according to this disclosure apportion the voltages applied to voice coils 3A and 3B according to knowledge of the position of form 4 and can compensate for non-linearity, act to reduce the DMP of speaker 5, which differs from the neutral position when the average of the input signal is non-zero for significant periods of time. Further, due to the displacement, i.e., the position of form 4 with respect to the neutral position determining which of voice coils 3A, 3B has more electromagnetic coupling with the magnetic field of ring magnet 2, asymmetrical voltages supplied to voice coils 3A, 3B can be used to reduce the required total electrical input power for a given acoustic power level, raising electroacoustic efficiency, or to expend additional electrical input power in order to achieve a greater acoustic output power within limits of thermal handling and the available power supply/amplifier capability.

Figure 2A:
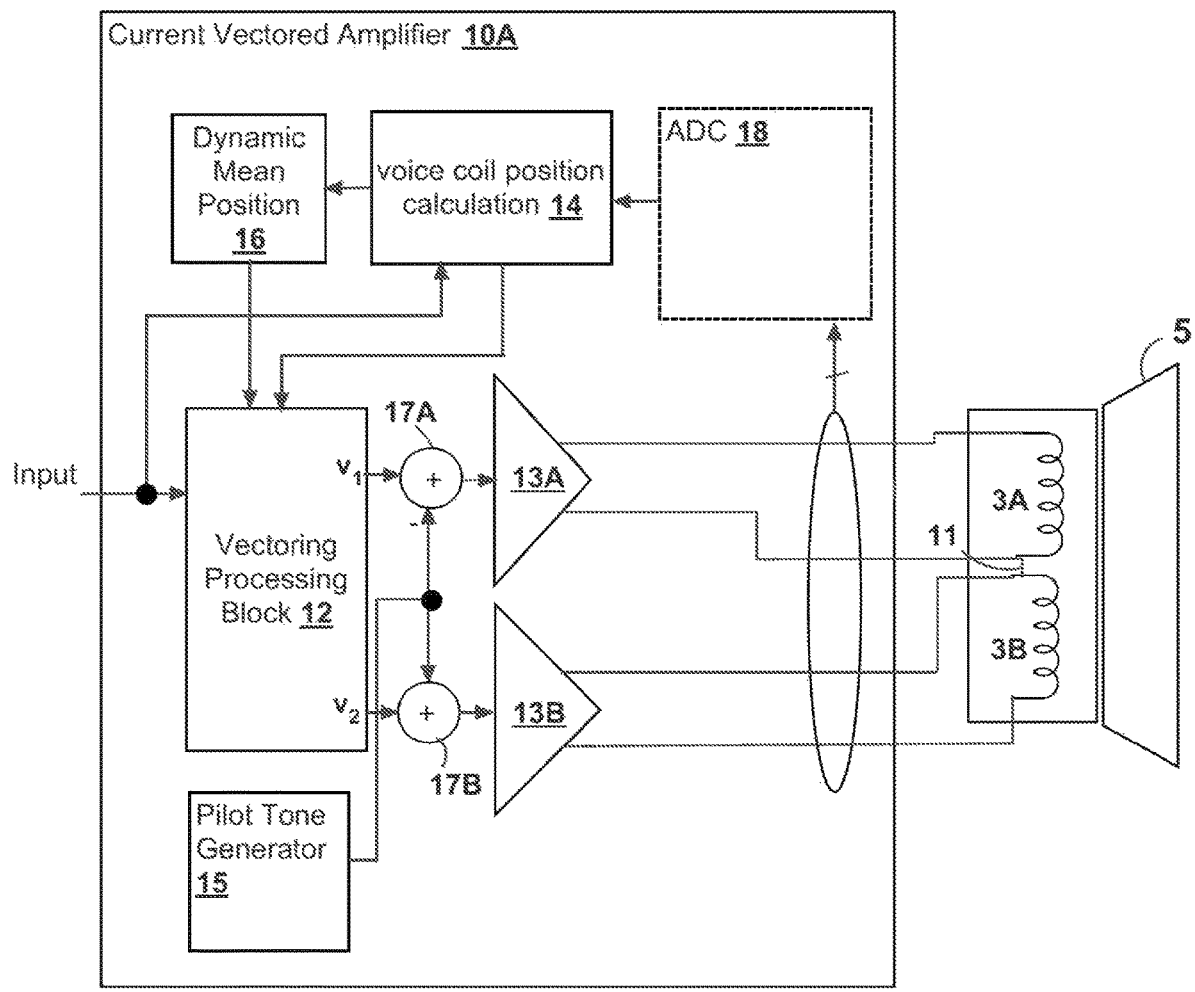
FIG. 2A is a block diagram of a system including a segmented voice coil speaker, according to an embodiment of the disclosure.

While the following description is with reference to a circuit block diagram, it is understood that the description and the calculations included therein are applicable to a process that may be implemented by a digital signal processor executing a computer program product according to an embodiment of the disclosure as described in further detail below. Referring to FIG. 2A, an amplification system in the form of a current vectored amplifier circuit 10A is shown. Voice coils 3A and 3B of speaker 5 are supplied with output voltage and current from amplifiers 13A and 13B, respectively. The sum of the voltages is the same, regardless of the instantaneous vectoring ratio, so the circuit can be viewed as a standard amplifier channel providing a voltage to a single voice coil speaker, but injecting an additional current through the common terminal to shift the voltage of the common terminal with respect to the other terminals of the voice coil, which shifts the amount of current supplied to each of the voice coils. A connection 11 is shown optionally connecting voice coils 3A and 3B in series, representing a segmented (tapped) voice coil. A vectoring processing block 12 receives an input signal Input which is generally in the form of discrete samples of program material to be reproduced if vectoring processing block 12 is a digital signal processor, which is generally the case, although the disclosure is not limited to digital signal processors and an analog circuit could be adapted to perform some or all of the functions detailed herein. Further, it may not be necessary to use a general-purpose digital signal processor to implement vectoring processing block 12, as look-up tables may be used to perform some or all of the transformations needed to produce vectored input signals v1, v2 that are provided to the inputs of amplifiers 13A and 13B, respectively. Vectoring processing block 12 generates vectored input signals v1, v2 from input signal Input and an indication of the position of the voice coil assembly of speaker 5, i.e., the position of form 4 with respect to the neutral position received from a voice coil position calculation block 14. The position of the voice coil assembly may be determined via channels of an analog-to-digital (ADC) converter 18 that measure the voltages at the outputs of amplifiers 13A and 13B, and will also generally measure the current supplied to voice coils 3A, 3B, by measurement techniques such as voltage sensing across a series resistor, current mirroring in the output stages of amplifiers 13A and 13B or other known current-sensing techniques. Alternatively, if the characteristics of speaker 5 are well known, the position of the voice coil assembly may be predicted from the history and instantaneous value of input signal Input using the Thiele/Small parameter model. A dynamic mean position calculation block 16 determines the DMP from the indication of voice coil assembly position generated by voice coil position calculation block 14.

Figure 2B:
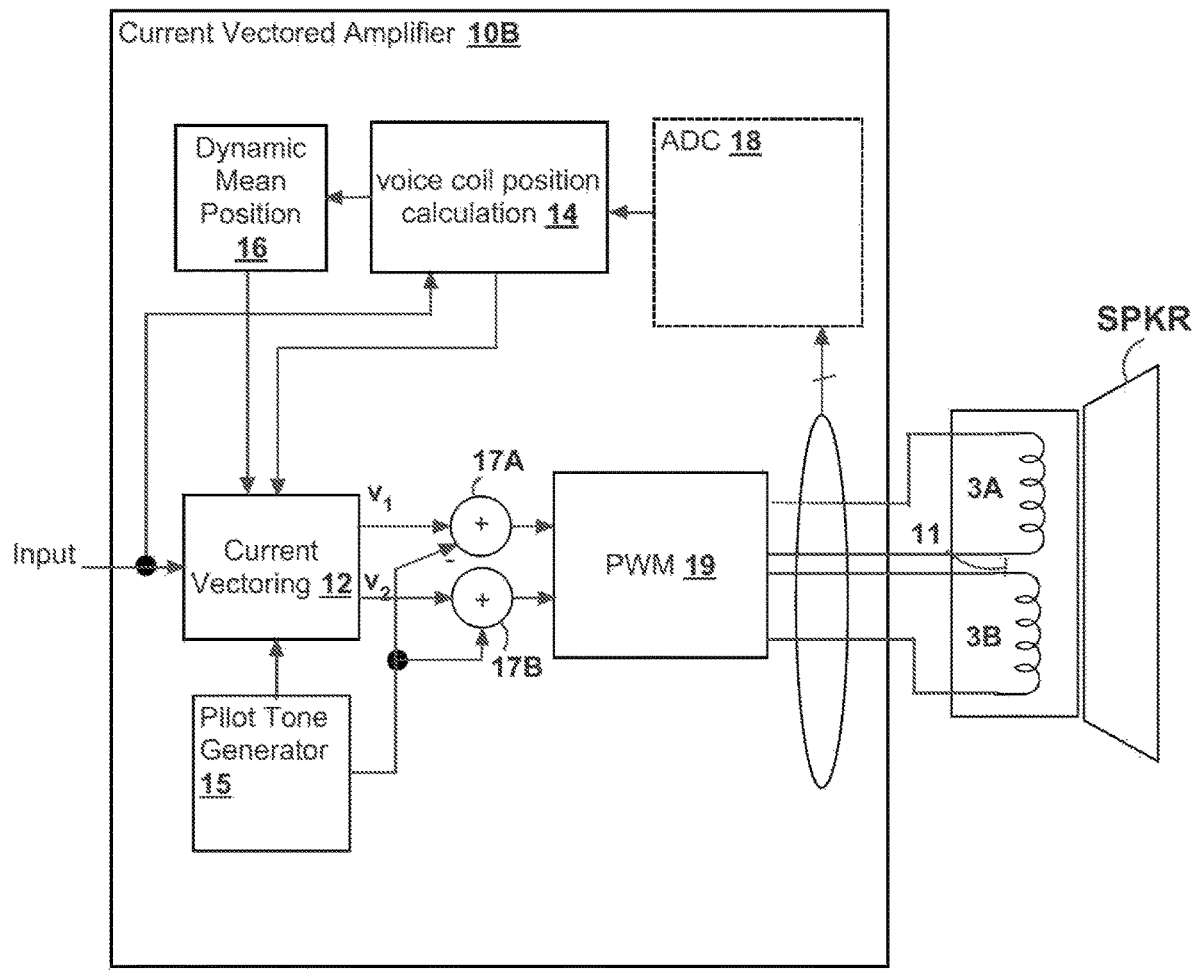
FIG. 2B is a block diagram of another system including a segmented voice coil speaker, according to another embodiment of the disclosure.

Referring now to FIG. 2B, another amplification system is shown in the form of a current vectored amplifier 10B connected to voice coils 3A and 3B of speaker 5. Current vectored amplifier 10B is similar to current vectored amplifier 10A of FIG. 2A, so only differences between them are described below. Instead of analog amplifiers, current vectored amplifier 10B uses a pulse width modulator (PWM) having sufficient channels to supply current pulses to the terminals of voice coils 3A and 3B, which may require only three outputs if voice coils 3A and 3B are connected in series, i.e., connection 11 is present, or may require four outputs if voice coils 3A and 3B are isolated. Filtering may be needed at the input channels to ADC 18, in order to obtain the resultant voltage and current waveforms reliably.

Figure 3A:
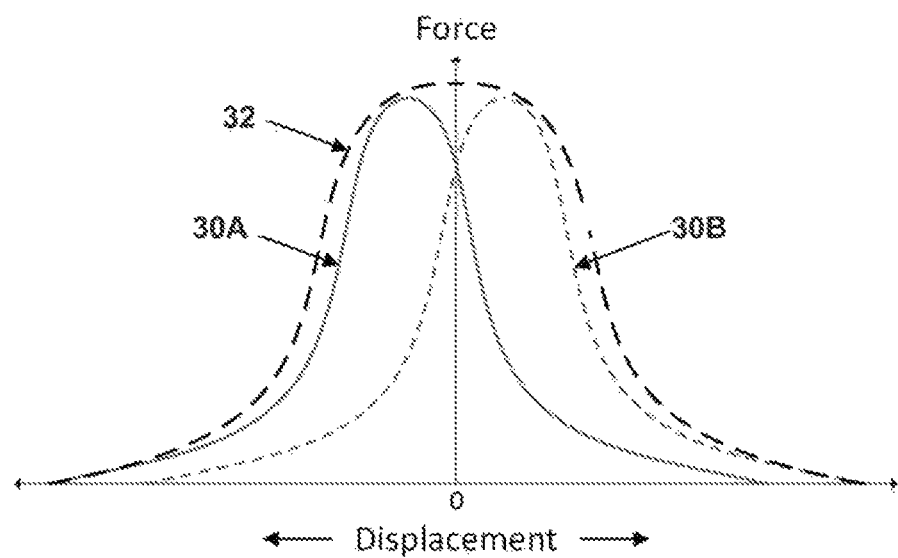
FIG. 3A is a graph illustrating idealized electromotive force (Bl) versus displacement for a given level of input current in a dual voice-coil micro speaker as may be employed in the systems of FIG. 2A and FIG. 2B.

Referring now to FIG. 3A, an idealized response of individual voice coils and a combined controlled response under a vectored control is shown in a graph of electromotive force vs. displacement for a reference input current. As can be seen from curve 30B of the graph, the back coil (e.g., voice coil 3B in FIGS. 1A-1C), has the greatest force for positive displacement and the front coil (e.g., voice coil 3A in FIGS. 1A-1C) has the greatest force for negative displacement as seen in curve 30A, with the peaks corresponding roughly to the voice coil assembly position that places the corresponding voice coil in the center of the magnetic field of the speaker. The combined controlled response shown in curve 32 shows the potential for providing a more uniform performance with current vectoring, which falls off as both voice coils lose efficiency at the extreme displacements, but has a substantially even response in the central region where one or the other of the voice coils can provide a significant electromotive force. Without vectoring, the series or parallel combination at the extremes of the graph would provide half of the power to a voice coil that is not providing very much electroacoustic response at all.

Figure 3B:
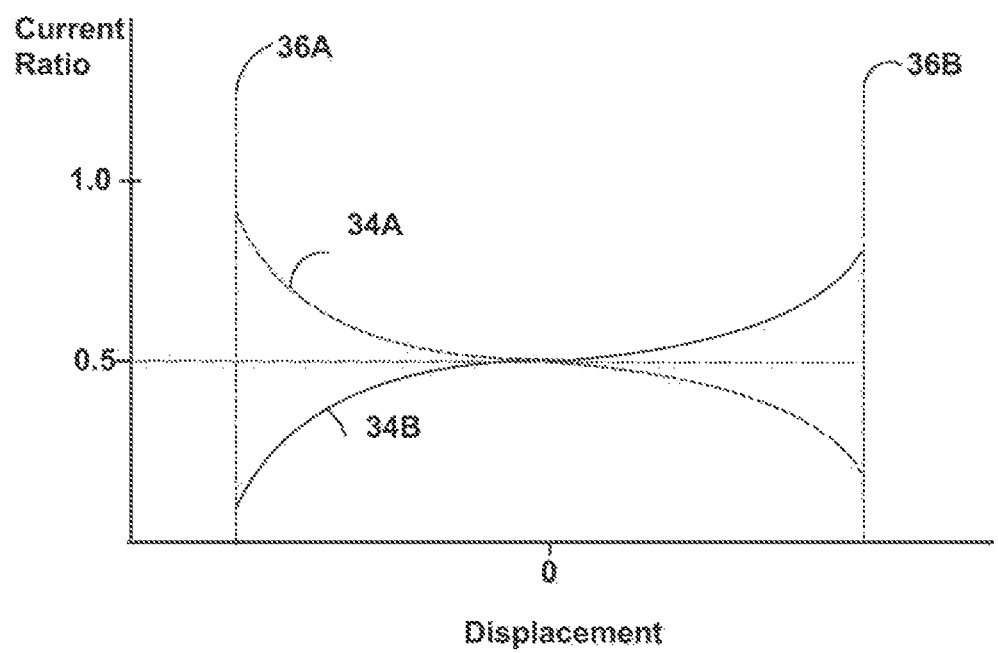
FIG. 3B is a graph illustrating a current vectoring scheme as may be employed in the systems of FIG. 2A and FIG. 2B.

Referring now to FIG. 3B, an example of a current vectoring scheme is shown, as may be employed in current vectoring amplifiers 10A and 10B of FIGS. 2A and 2B, respectively. Curve 34A shows a factor by which input signal Input would be multiplied by a factor to obtain the current to supply to voice coil 3A and curve 34B shows a factor by which input signal Input would be multiplied by a factor to obtain the current to supply to voice coil 3B. The value of curves 34A and 34B is 0.5 at zero displacement (neutral position), which corresponds to the idealized graph shown in FIG. 3A. A computation can be made by multiplying input signal Input by the factors shown in curves 34A and 34B for all amplitudes of the input signal, or curves 34A and 34B can themselves be varied by input signal amplitude in order to optimize the response of the displacement vs. input signal level. Boundaries 36A and 36B correspond to an excursion limit beyond which all of the vector coefficients are set to zero, which may be due to a maximum mechanical displacement specification, or thermal considerations.

Figure 4A:
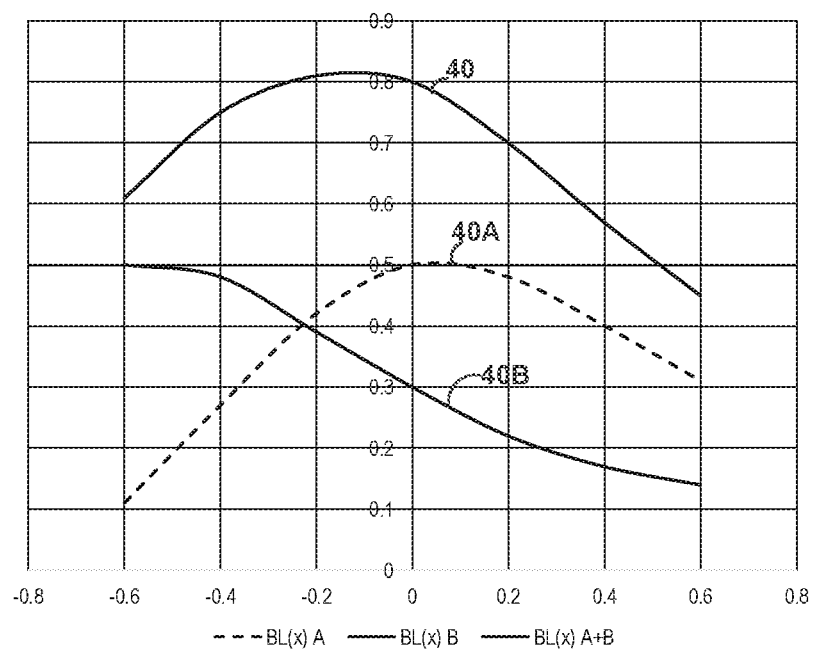
FIG. 4A is a graph showing actual electromotive force (Bl) vs. displacement for a given level of input current in a dual voice-coil micro speaker as may be employed in the systems of FIG. 2A and FIG. 2B

Referring now to FIG. 4A, a graph of a measured speaker voice coil electromotive force transfer is shown. Curve 40 shows a combined response of two voice coils, while curve 40A and curve 40B show the response for front voice coil and back voice coil, respectively. As can be seen from curve 40A, the response of the front voice coil is not symmetric with the response of the back voice coil in curve 40B, and the displacement at which curves 40A and 40B cross is not at the neutral position, but at a displacement of approximately −0.2 mm. Neither does the curvature of the front voice coil response curve 40A match back voice coil response curve 40B. Front voice coil response curve 40A tapers off more gradually with positive displacement, which indicates less of an increase in vectoring toward the back voice coil would be desirable for positive displacements, while the response of the back voice coil falls off more rapidly for negative displacements. Therefore, suitable vectoring can be derived from a graph such as FIG. 4A for each particular speaker design, in order to provide a more linear response and/or increase efficiency.

Figure 4B:
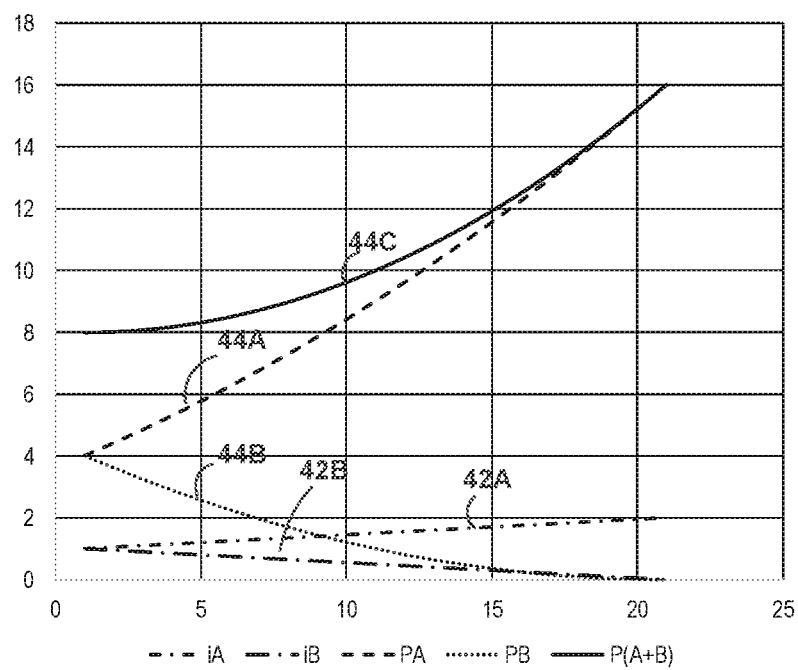
FIG. 4B is a graph showing actual power and current requirements vs. signal amplitude in a current vectoring scheme for a dual micro voice-coil speaker as may be employed in the systems of FIG. 2A and FIG. 2B.

When determining a particular vectoring scheme, it is necessary to be cognizant of the increase in power that generally occurs with vectoring. In the extreme case, since the impedance of a single voice coil is half that of their connection in series, assuming equal impedances for the two voice coils, twice the power is required for the same voltage imposed on a single one of the voice coils. FIG. 4B shows the current vs. a vectoring ratio for the two voice coils in curves 42A, 42B and curves 44A, and 44B show the respective power required for the currents in curves 42A and 42B. Curve 44C shows the total power required, which for small amounts of vectoring, i.e., voltage ratios less than 5:1, generates only a moderate increase in required power. Table I below shows values of power versus displacement for different vector ratios for a particular speaker. For each displacement column, there is a minima (highlighted in bold text) in the power required for production of the displacement at particular differing vector ratios. By choosing the vector ratio according to the power minima, efficiency of the speaker operation is improved. Similarly, the power maxima could be chosen (within a predetermined limit for thermal and power supply limitations) from each column in order to maximize the power transferred to the speaker.

TABLE I

| Vector Ratio | In | | | Displacement | | | Out |
|---|---|---|---|---|---|---|---|
| 0.5:0.5 | 8 | 8 | 8 | 8 | 8 | 8 | 8 |
| — | 7.53 | 7.80 | 7.99 | 7.82 | 7.73 | 7.71 | 7.73 |
| — | 7.14 | 7.65 | 8.02 | 7.69 | 7.51 | 7.47 | 7.50 |
| — | 6.81 | 7.53 | 8.09 | 7.60 | 7.34 | 7.27 | 7.33 |
| — | 6.54 | 7.46 | 8.20 | 7.55 | 7.21 | 7.12 | 7.19 |
| — | 6.32 | 7.42 | 8.34 | 7.53 | 7.12 | 7.01 | 7.10 |
| — | 6.14 | 7.42 | 8.53 | 7.55 | 7.06 | 6.94 | 7.04 |
| — | 6.00 | 7.45 | 8.75 | 7.59 | 7.03 | 6.89 | 7.01 |
| — | 5.89 | 7.50 | 9.01 | 7.67 | 7.03 | 6.88 | 7.00 |
| — | 5.80 | 7.59 | 9.31 | 7.77 | 7.06 | 6.89 | 7.03 |
| — | 5.74 | 7.69 | 9.64 | 7.90 | 7.11 | 6.92 | 7.07 |
| — | 5.70 | 7.82 | 10.01 | 8.05 | 7.18 | 6.98 | 7.14 |
| — | 5.68 | 7.98 | 10.41 | 8.23 | 7.28 | 7.05 | 7.23 |
| — | 5.68 | 8.15 | 10.85 | 8.42 | 7.38 | 7.14 | 7.34 |
| — | 5.69 | 8.33 | 11.33 | 8.63 | 7.51 | 7.25 | 7.46 |
| — | 5.71 | 8.54 | 11.83 | 8.86 | 7.65 | 7.37 | 7.59 |
| — | 5.74 | 8.76 | 12.3 8 | 9.11 | 7.80 | 7.50 | 7.74 |
| — | 5.78 | 8.99 | 12.95 | 9.37 | 7.96 | 7.64 | 7.90 |
| — | 5.83 | 9.24 | 13.56 | 9.65 | 8.13 | 7.79 | 8.06 |
| — | 5.89 | 9.50 | 14.20 | 9.94 | 8.32 | 7.95 | 8.24 |
| 0:1 | 5.95 | 9.77 | 14.88 | 10.24 | 8.51 | 8.12 | 8.43 |

Figure 5:
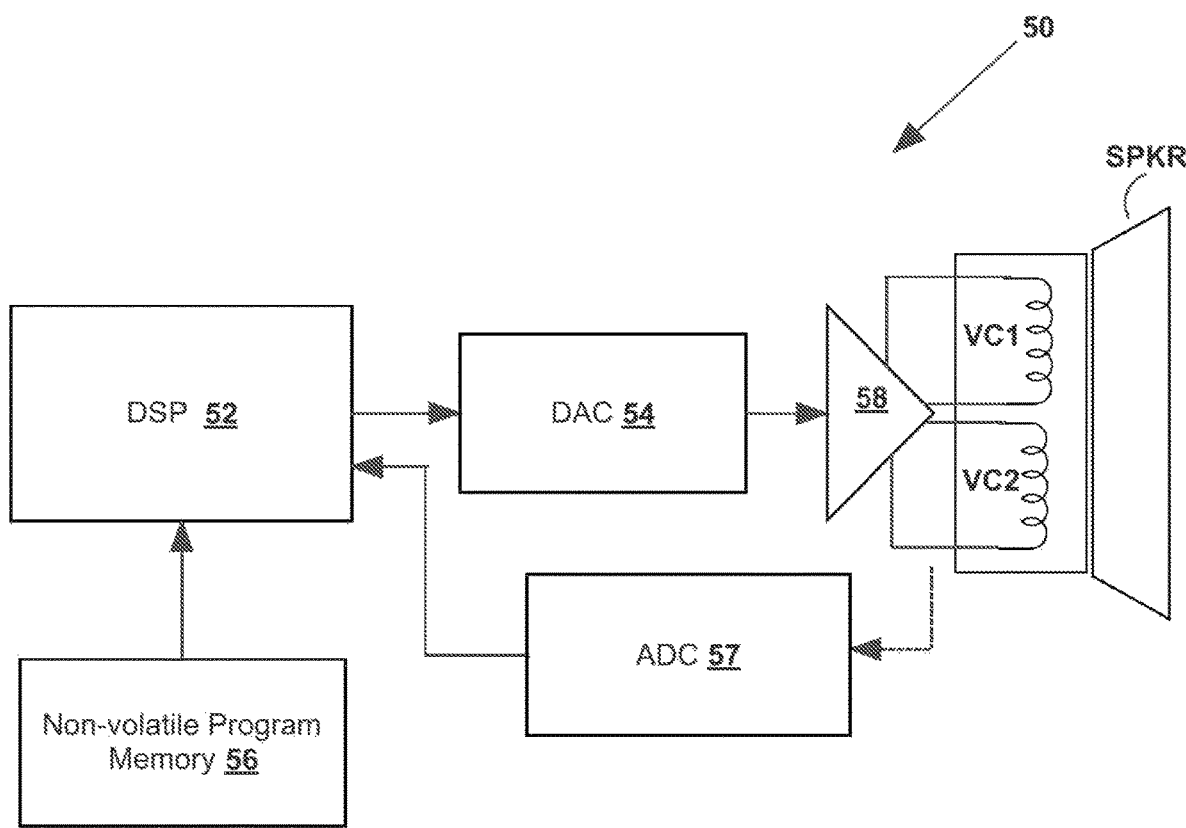
FIG. 5 is a block diagram of a digital signal processing system in which techniques according to an embodiment of the present disclosure are practiced.

Referring now to FIG. 5, a digital signal processing system is shown, which can be used to implement the techniques of the present disclosure. A digital signal processor (DSP) 52 (or a suitable general purpose processor) executes program instructions stored in a non-volatile memory 56 and that form a computer-program product in accordance with the present disclosure. DSP 52 receives samples of a signal at an Input and samples of voice coil voltage and current sensing from an ADC 57. A digital-to-analog converter 54 receives output values corresponding to the vectored output signals including the pilot tone in the appropriate phases and provides analog output signals to an amplifier block 58 which provides the drive signals to voice coils VC1 and VC2.

Figure 6A:
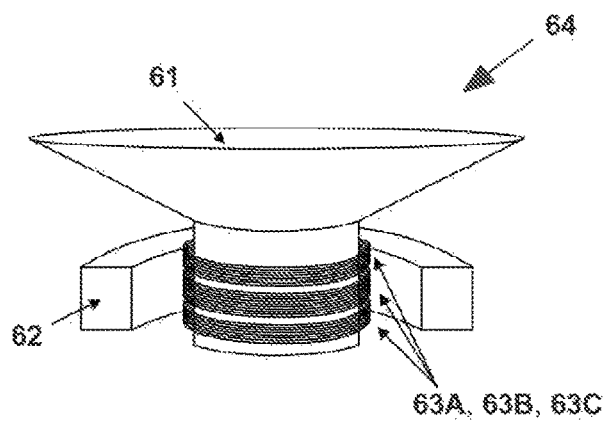
FIG. 6A is an illustration of a speaker with a segmented voice coil arrangement having three voice coils.
Figure 6B:
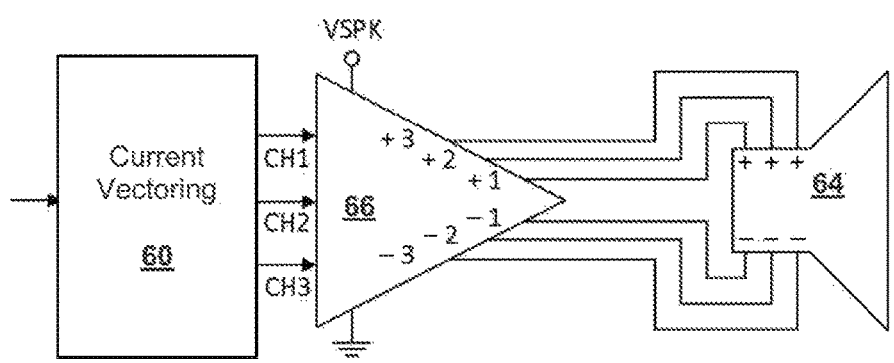
FIG. 6B is an electrical block diagram of a system that may be used to supply power to the speaker of FIG. 6A.
Figure 6C:
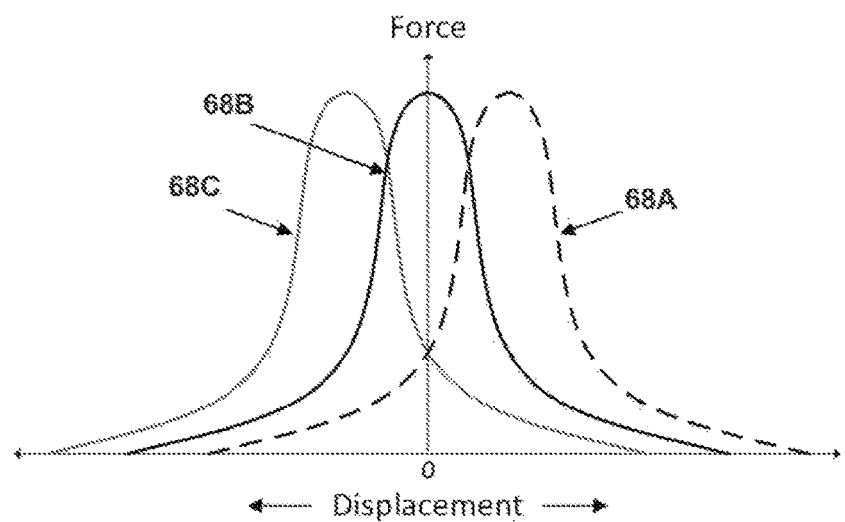
FIG. 6C is a graph illustrating idealized electromotive force versus displacement for a given level of input current in the speaker of FIG. 6A.

Referring now to FIG. 6A a triple voice coil speaker 64 is shown, which can also be driven by circuits and systems according to the disclosure above, except that the vectoring determines three voltages instead of two. The three voice coils 63A, 63B and 63C are mechanically connected to a cone 61 of speaker 64 and move within a magnetic field generated by a permanent ring magnet 62. Any number of segments of a voice coil, or number of separate voice coil windings can be driven in a vectored manner, with a resulting increase of complexity and number of voice coil signal outputs. FIG. 6B shows a system for supplying signals to speaker 64 include an amplifier 62 with six voice coil signal outputs and a current vectoring processor 60. FIG. 6C shows an idealized response of speaker 64 in which each of the coils have a different peak electromotive force transfer response shown in curves 68A, 68B and 68C, which correspond to back coil 63A, center coil 63B and front coil 63C.

As mentioned above portions or all of the disclosed process may be carried out by the execution of a collection of program instructions forming a computer program product stored on a non-volatile memory, but that also exist outside of the non-volatile memory in tangible forms of storage forming a computer-readable storage medium. The computer-readable storage medium may be, for example, but is not limited to, an electronic storage device, a magnetic storage device, an optical storage device, an electromagnetic storage device, a semiconductor storage device, or any suitable combination of the foregoing. Specific examples of the computer-readable storage medium includes the following: a hard disk, semiconductor volatile and non-volatile memory devices, a portable compact disc read-only memory (CD-ROM) or a digital versatile disk (DVD), a memory stick, a floppy disk or other suitable storage device not specifically enumerated. A computer-readable storage medium, as used herein, is not to be construed as being transitory signals, such as transmission line or radio waves or electrical signals transmitted through a wire. It is understood that blocks of the block diagrams described above may be implemented by computer-readable program instructions. These computer readable program instructions may also be stored in other storage forms as mentioned above and may be downloaded into a non-volatile memory for execution therefrom. However, the collection of instructions stored on media other than the non-volatile memory described above also form a computer program product that is an article of manufacture including instructions which implement aspects of the functions/actions specified in the block diagram block or blocks.

In summary, this disclosure shows and describes an audio power output circuit that provides a pair of output signals to an audio output transducer that has two different voice coils. Using a measured or predicted position of the voice coil assembly with respect to the transducer's magnetic field, a processing circuit generates the pair of signals such that a first relationship between a first one of the pair of output signals and an audio input signal and a second relationship between a second one of the pair of the output signals vary with the position of the voice coil. Offset in the Dynamic Mean Position (DMP) can be compensated for without adding low frequency or direct current components that compromise the dynamic range of the transducer. The efficiency, acoustic output power and/or linearity of the acoustic output of the transducer may be optimized by tailoring the first and second relationship to a particular target performance.

The processing circuit may derive the first output signal and the second output signal so that a first relationship between the first output signal and the audio input signal and a second relationship between the second output signal and the audio input signal vary dependent on the indication of the position of the voice coil, and the processing circuit may generate the first output signal by multiplying the audio input signal by a first factor may and generate the second output signal by multiplying the audio input signal by a second factor. The first factor and the second factor may vary dependent on the indication of the position such that total power delivered to the voice coils is minimized for multiple different displacements of the position of the voice coils with respect to the magnetic field of the audio output transducer, or so that an acoustic output of the audio output transducer is maximized for multiple different displacements of the position of the voice coils with respect to the magnetic field of the audio output transducer, or so that a position of the position of the voice coil with respect to the magnetic field of the audio output transducer is linearized with respect to the amplitude of the audio input signal. The processing circuit may also derive the first output signal and the second output signal to direct a correction current into at least one of the two different voice coils in response to detecting dynamic mean position offset in the indication of position. The processing circuit may estimate the indication of the position from the audio input signal alone or in combination with predetermined model parameters for a particular audio output transducer. Alternatively, or in combination, the processing circuit may include a sensing circuit for sensing one or more electrical signal values at one or more terminals of the two different voice coils and that provides the indication of position to the processing circuit. The processing circuit may add a pilot tone to at least one of the first output signal or the second output signal, and sense a response of the audio output transducer to the pilot tone.

While the disclosure has shown and described particular embodiments of the techniques disclosed herein, it will be understood by those skilled in the art that the foregoing and other changes in form, and details may be made therein without departing from the spirit and scope of the disclosure. For example, the techniques shown above may be applied using multiple pre-defined sets of vectoring profiles and selecting between them according to a user input or detected speaker type.

What is claimed is:

1. An audio circuit for supplying at least two audio output signals for driving at least two different voice coils of an audio output transducer, comprising:
   an audio input for receiving an audio input signal; and
   a processing circuit coupled to the audio input for generating a first output signal and a second output signal different from the first output signal, wherein the processing circuit generates the first output signal and the second output signal from the audio input signal and an indication of a position of the at least two different voice coils of the audio output transducer with respect to a magnetic field of the audio output transducer, wherein the processing circuit generates the first output signal by multiplying the audio input signal by a first factor and generates the second output signal by multiplying the audio input signal by a second factor, wherein the first factor and the second factor vary dependent on the indication of the position, so that a total power delivered to the at least two different voice coils is minimized or an acoustic output of the audio output transducer is maximized for multiple different displacements of the position of the at least two different voice coils with respect to the magnetic field of the audio output transducer, wherein the first output signal is an output signal for driving a first one of the at least two different voice coils, wherein the second output signal is an output signal for driving a second one of the at least two different voice coils that is adjacent to and has a same electrical phase with the first one of the at least two different voice coils, and wherein the first output signal and the second output signal have a same polarity.

2. The audio circuit of claim 1, wherein the first factor and the second factor vary dependent on the indication of the position such that the total power delivered to the at least two different voice coils is minimized for multiple different displacements of the position of the at least two different voice coils with respect to the magnetic field of the audio output transducer.

3. The audio circuit of claim 1, wherein the first factor and the second factor vary dependent on the indication of the position such that an acoustic output of the audio output transducer is maximized for multiple different displacements of the position of the at least two different voice coils with respect to the magnetic field of the audio output transducer.

4. The audio circuit of claim 1 wherein the first factor and the second factor vary dependent on the indication of the position such that a position of the at least two different voice coils with respect to the magnetic field of the audio output transducer is linearized with respect to the amplitude of the audio input signal.

5. The audio circuit of claim 1, wherein processing circuit generates the first output signal and the second output signal to direct a correction current into at least one of the at least two different voice coils in response to detecting dynamic mean position offset in the indication of position.

6. The audio circuit of claim 1, wherein the processing circuit estimates the indication of the position from the audio input signal.

7. The audio circuit of claim 6, wherein the estimating estimates the indication of the position from the audio input signal and predetermined model parameters for a particular audio output transducer.

8. The audio circuit of claim 1, further comprising a sensing circuit for sensing one or more electrical signal values at at least one terminal of the at least two different voice coils, and wherein the sensing circuit provides the indication of position to the processing circuit.

9. The audio circuit of claim 8, wherein the processing circuit adds a pilot tone to at least one of the first output signal or the second output signal, and wherein the sensing circuit senses a response of the audio output transducer to the pilot tone.

10. A method of controlling electrical power supplied to at least two different voice coils of an audio output transducer, the comprising:
    receiving an audio input signal;
    first generating a first output signal from the audio input signal and an indication of a position of the at least two different voice coils of the audio output transducer with respect to a magnetic field of the audio output transducer; and
    second generating a second output signal different from the first output signal and from the audio input signal and the indication of the position, wherein the first generating generates the first output signal by multiplying the audio input signal by a first factor and the second generating generates the second output signal by multiplying the audio input signal by a second factor, wherein the first factor and the second factor vary dependent on the indication of the position such that that a total power delivered to the at least two different voice coils is minimized or an acoustic output of the audio output transducer is maximized for multiple different displacements of the position of the at least two different voice coils with respect to the magnetic field of the audio output transducer, wherein the first output signal is an output signal for driving a first one of the at least two different voice coils, wherein the second output signal is an output signal for driving a second one of the at least two different voice coils that is adjacent to and has a same electrical phase with the first one of the at least two different voice coils, and wherein the first output signal and the second output signal are generated with a same polarity.

11. The method of claim 10, wherein the first factor and the second factor vary dependent on the indication of the position such that total power delivered to the at least two different voice coils is minimized for multiple different displacements of the position of the at least two different voice coils with respect to the magnetic field of the audio output transducer.

12. The method of claim 10, wherein the first factor and the second factor vary dependent on the indication of the position such that an acoustic output of the audio output transducer is maximized for multiple different displacements of the position of the at least two different voice coils with respect to the magnetic field of the audio output transducer.

13. The method of claim 10, wherein the first factor and the second factor vary dependent on the indication of the position such that a position of the at least two different voice coils with respect to the magnetic field of the audio output transducer is linearized with respect to the amplitude of the audio input signal.

14. The method of claim 10, further comprising:
determining a dynamic mean position of the voice coils from the indication of the position; and
adjusting the first output signal and the second output signal to direct a correction current into at least one of the at least two different voice coils to reduce the dynamic mean position of the voice coils.

15. The method of claim 14, wherein the estimating estimates the indication of the position from the audio input signal and predetermined model parameters for a particular audio output transducer.

16. The method of claim 10, further comprising estimating the indication of the position from the audio input signal.

17. The method of claim 10, further comprising:
sensing one or more electrical signal values at at least one terminal of the at least two different voice coils; and
determining the indication from the one or more electrical signal values.

18. The method of claim 17, further comprising adding a pilot tone to at least one of the first output signal or the second output signal, and wherein the sensing senses a response of the audio output transducer to the pilot tone.

19. An audio circuit for supplying at least two audio output signals for driving at least two different voice coils of an audio output transducer, comprising:
an audio input for receiving an audio input signal; and
a processing circuit coupled to the audio input for generating a first output signal and a second output signal different from the first output signal, wherein the processing circuit generates the first output signal and the second output signal from the audio input signal and an indication of a position of the at least two different voice coils of the audio output transducer with respect to a magnetic field of the audio output transducer, so that a first relationship between the first output signal and the audio input signal and a second relationship between the second output signal and the audio input signal vary dependent on the indication of the position of the at least two different voice coils, wherein the processing circuit generates the first output signal by multiplying the audio input signal by a first factor and generates the second output signal by multiplying the audio input signal by a second factor, wherein the first factor and the second factor vary dependent on the indication of the position such that total power delivered to the voice coils is minimized for multiple different displacements of the position of the at least two different voice coils with respect to the magnetic field of the audio output transducer or an acoustic output of the audio output transducer is maximized for multiple different displacements of the position of the voice coils with respect to the magnetic field of the audio output transducer, wherein the first output signal is an output signal for driving a first one of the at least two different voice coils, wherein the second output signal is an output signal for driving a second one of the at least two different voice coils that is adjacent to and has a same electrical phase with the first one of the at least two different voice coils, and wherein the first output signal and the second output signal have a same polarity.

* * * * *

UNITED STATES PATENT AND TRADEMARK OFFICE
CERTIFICATE OF CORRECTION

PATENT NO. : 11,102,583 B1
APPLICATION NO. : 16/829286
DATED : August 24, 2021
INVENTOR(S) : Doy et al.

Page 1 of 1

It is certified that error appears in the above-identified patent and that said Letters Patent is hereby corrected as shown below:

In the Specification

In Column 1, Line 9, delete "Apr. 23, 2019" and insert -- Apr. 19, 2019 --, therefor.

In the Claims

In Column 10, Line 18, in Claim 4, delete "claim 1" and insert -- claim 1, --, therefor.

Signed and Sealed this
Fifth Day of October, 2021

Drew Hirshfeld
*Performing the Functions and Duties of the*
*Under Secretary of Commerce for Intellectual Property and*
*Director of the United States Patent and Trademark Office*